United States Patent [19]
Lau et al.

[11] Patent Number: 5,106,437
[45] Date of Patent: Apr. 21, 1992

[54] ELECTROMAGNETIC RADIATION SUPPRESSION COVER

[75] Inventors: Felix P. Lau, Austin; Donald M. Yenni, Jr., Round Rock, both of Tex.; Ronald W. Seemann, Roseville; Richard J. Kuo, St. Paul, both of Minn.

[73] Assignee: Minnesota Mining and Manufacturing Company, St. Paul, Minn.

[21] Appl. No.: 314,986

[22] Filed: Feb. 24, 1989

Related U.S. Application Data

[63] Continuation-in-part of Ser. No. 125,597, Nov. 25, 1987, Pat. No. 4,814,546.

[51] Int. Cl.$^5$ .................. H01B 13/22; B29C 61/02; B29C 63/44
[52] U.S. Cl. ........................... 156/51; 156/52; 156/84; 156/86; 156/211; 174/DIG. 8; 264/342 R
[58] Field of Search ............... 428/303, 349, 346, 355, 428/900; 156/53, 52, 84, 86, 211; 174/35 MS, 36, DIG. 8; 252/62.54, 62.56, 519; 342/1; 264/342 R

[56] References Cited

U.S. PATENT DOCUMENTS

| | | | |
|---|---|---|---|
| 2,027,962 | 1/1936 | Currie | 264/230 |
| 2,249,091 | 7/1941 | Robinson et al. | 29/25.03 |
| 2,863,132 | 12/1958 | Sowa | 439/730 |
| 3,191,132 | 6/1965 | Mayer | 333/184 |
| 3,240,621 | 3/1966 | Flower, Jr. et al. | 427/48 |
| 3,526,896 | 9/1970 | Wesch | 342/1 |
| 3,843,593 | 10/1974 | Shell et al. | 524/424 |
| 3,865,627 | 2/1975 | Roden et al. | 360/134 |
| 3,908,267 | 9/1975 | Loyd et al. | 29/631 |
| 3,938,152 | 2/1976 | Grimes et al. | 342/1 |
| 3,950,604 | 4/1976 | Penneck | 174/68.1 |
| 3,951,904 | 4/1976 | Tomonaga | 523/137 |
| 4,003,840 | 1/1977 | Ishino et al. | 252/62 |
| 4,016,356 | 4/1977 | McLoughlin | 174/35 R |
| 4,024,318 | 5/1977 | Forster et al. | 428/519 |
| 4,101,699 | 7/1978 | Stine et al. | 428/36.91 |
| 4,116,906 | 9/1978 | Ishino et al. | 523/137 |
| 4,137,342 | 1/1979 | Kanten | 427/127 |
| 4,153,661 | 5/1979 | Ree et al. | 264/120 |
| 4,163,117 | 7/1979 | Campbell et al. | 174/74 A |
| 4,173,018 | 10/1979 | Dawson et al. | 342/1 |
| 4,226,909 | 10/1980 | Kanten | 428/329 |
| 4,251,304 | 2/1981 | Campbell et al. | 156/85 |
| 4,319,074 | 3/1982 | Yaste et al. | 174/116 |
| 4,363,842 | 12/1982 | Nelson | 428/36 |

(List continued on next page.)

OTHER PUBLICATIONS

David L. Dye et al., "Theoretical Investigation of Fibers," Boeing Aerospace Company, Seattle, Washington, draft report for department of Defense Contract DAAK11-82-C-0152, 1983, pp. 3-5, 10-11, 13-19, 27-44, 101-111, 142-144.

U.S. patent application Ser. No. 07/302,427 to Boyer, III et al., filed Jan. 26, 1989.

*Primary Examiner*—George F. Lesmes
*Assistant Examiner*—Christopher Brown
*Attorney, Agent, or Firm*—Gary L. Griswold; Warren R. Bovee; Peter Forrest

[57] ABSTRACT

A conformable electromagnetic radiation suppression cover comprising one or more absorbing material(s) and a sealant. The cover conforms to the shape of a reflecting structure due to forces internal to the absorbing material(s) when the cover is subjected to an agent external to the cover. The absorber comprises dissipative particles bound in a conformable polymeric binder. The sealant is positioned to seal the conformable cover to the reflecting structure, and provides environmental protection to the structure and preferably better adhesion between the cover and the structure. In a preferred embodiment, the volume of the cover is varied before shrinkage to produce a cover thickness in the direction of incident radiation, as measured after shrinkage, which produces a preselected resonant frequency for the cover. The cover may include a conductive surface, such as a metallic foil. Impedance matching materials are preferred but not required.

4 Claims, 2 Drawing Sheets

U.S. PATENT DOCUMENTS

| | | | |
|---|---|---|---|
| 4,414,339 | 11/1983 | Solc et al. | 528/137 |
| 4,421,582 | 12/1983 | Horsma et al. | 156/86 |
| 4,486,721 | 12/1984 | Cornelius et al. | 333/1 |
| 4,493,912 | 1/1985 | Dudgeon et al. | 523/137 |
| 4,499,438 | 2/1985 | Cornelius et al. | 333/1 |
| 4,512,833 | 4/1985 | Kridl et al. | 156/94 |
| 4,538,151 | 8/1985 | Hatakeyama et al. | 342/1 |
| 4,555,422 | 11/1985 | Nakamura et al. | 428/34.9 |
| 4,606,848 | 8/1986 | Bond | 252/511 |
| 4,624,879 | 11/1986 | Van Dijck et al. | 428/102 |
| 4,639,545 | 1/1987 | Pithouse et al. | 174/DIG. 8 |
| 4,654,473 | 3/1987 | Roux et al. | 174/84 R |
| 4,664,971 | 5/1987 | Soens | 428/288 |
| 4,690,778 | 9/1987 | Narumiya et al. | 252/506 |
| 4,699,743 | 10/1987 | Nakamura et al. | 264/104 |
| 4,709,948 | 12/1987 | Archer et al. | 285/381 |
| 4,731,273 | 3/1988 | Bonk | |
| 4,814,546 | 3/1989 | Whitney et al. | 174/36 |
| 4,865,892 | 9/1981 | Winfield et al. | 174/35 R |
| 4,896,000 | 1/1990 | Procter et al. | 174/74 R |

ELECTROMAGNETIC RADIATION SUPPRESSION COVER

CROSS REFERENCE TO RELATED APPLICATION

This application is a continuation-in-part of U.S. Application Number 07/125,597, filed Nov. 25, 1987, entitled ELECTROMAGNETIC RADIATION SUPPRESSION COVER, now U.S. Pat. No. 4,814,546.

TECHNICAL FIELD

This invention involves structural covers which suppress or absorb electromagnetic radiation.

BACKGROUND

Electromagnetic radiation absorbers typically are nonconductive composites of one or more kinds of dissipative particles dispersed in dielectric binder materials. The absorption performance of the composite absorber depends predominantly on the electromagnetic interactions of the individual particles with each other and with the binder. Various types of particles have been used including metals, magnetic metals, semiconductors, ferrites, and carbon; similarly, many kinds of dielectric binders have been used, including polymers and ceramics.

A common application of an absorber is a cover for a structure which would otherwise reflect radiation. The thickness of the cover and its mounting affect the desired absorption or suppression, but some composite materials are difficult to apply permanently to many structures, decreasing the performance of the cover. Also, the cover often must prevent moisture or other contaminants from reaching the underlying structure. Often a suppression cover must be applied in adverse weather by untrained personnel, but it should maintain a watertight seal, withstand temperature fluctuations, protect against corrosion, and the like.

Many covers contain absorbers which are designed for direct contact with a reflective conductor. If the conductor is the covered structure itself, gaps between the suppression cover and the conductive surface may significantly reduce the suppression performance of the cover.

SUMMARY OF THE INVENTION

The invention is a conformable electromagnetic radiation suppression cover for a reflecting structure, comprising a radiation absorber, and a sealant positioned to seal the conformed absorber to the reflecting structure. The cover conforms to the shape of the reflecting structure due to forces internal to the cover when the absorber is subjected to an agent external to the cover. The absorber comprises one or more types of dissipative particles dispersed in a conformable polymeric binder. The sealant is positioned to seal the conformable absorber to the reflecting structure.

In a preferred embodiment, the volume of the cover is selected or varied before shrinkage to produce a cover thickness in the direction of incident radiation, as measured after shrinkage, which produces a preselected resonant frequency (frequency of local maximum absorption) for the cover.

Various kinds of polymeric binders and various types of particles are suitable. The absorbing materials may have more than one type of particle, and more than one resonant frequency. The cover can be any of several configurations, including a hollow tube. An electrical conductor is preferably included on the side of the cover opposite that on which radiation is incident; usually this places the conductor on the side of the absorber nearest the reflecting structure.

The cover may be a laminate including more than one layer of absorbing material. Generally, each absorbing layer in a multilayer embodiment meets the criteria for the absorbing layer of a single layer embodiment. While the individual thicknesses, conforming properties, resonant frequencies, etc., may be different for different absorbing layers, the basic principles of operation and methods of manufacture are the same for each layer. Thus, the invention is described here in terms of single layer embodiments, with the understanding that multilayer embodiments are within the skill of the art and thus included.

Regardless of the number of absorbing layers, or the particular binder material or particle type chosen for any of the absorbing layers, the inventive cover meets at least one of the following criteria:

(A) measured at a frequency within a range of absorbed radiation frequencies, the imaginary part of at least one of the permittivity and permeability values of any absorbing layer is greater than or equal to ten percent of the corresponding real part;

(B) the electromagnetic reflection coefficient of the structure is reduced by no less than 70 percent (5.2 dB) as measured at a frequency within a range of absorbed radiation frequencies, after the cover has conformed to the reflecting structure;

(C) the thickness in the direction of radiation propagation of any absorbing layer is greater than one-fortieth but not greater than one-fourth of the wavelength of any radiation in a range of absorbed radiation frequencies, as measured after the cover has conformed to the reflecting structure.

DETAILED DESCRIPTION

Figure 1:
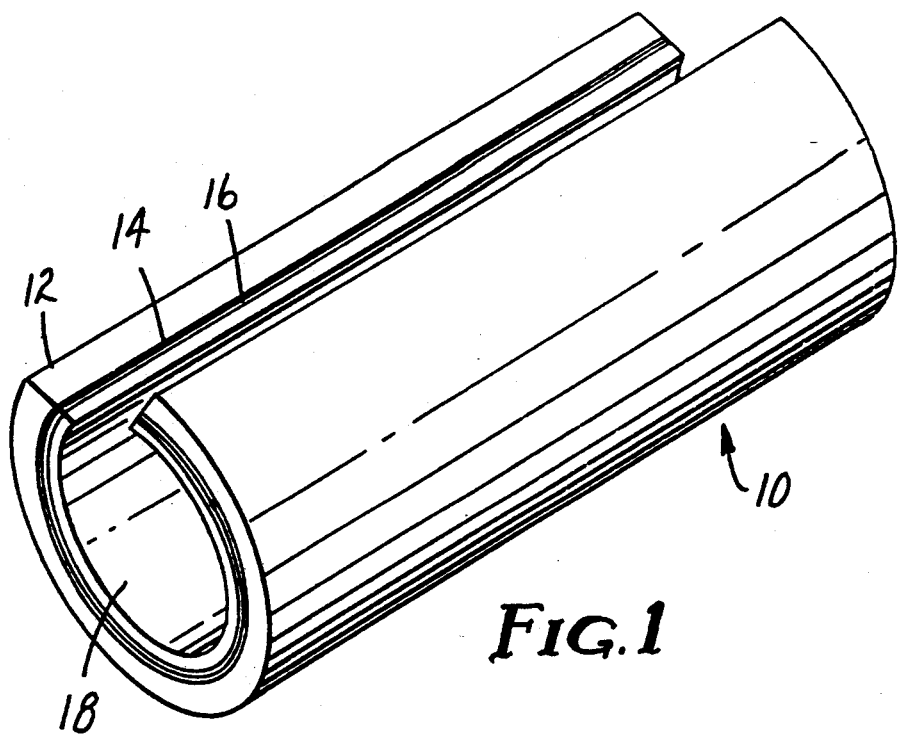
FIG. 1 is a perspective view of one embodiment of the invention.

FIG. 1 is a perspective view of an inventive suppression cover 10, which comprises electromagnetic radiation absorber 12, shown on the radiation incident side of the cover, and sealant 18 on the other side of the cover. Optional adhesive 14 holds optional ground plane 16 between absorber 12 and sealant 18.

Absorber 12 comprises a nonconductive composite of one or more kinds of dissipative particles dispersed in a shrinkable dielectric binder. The shrinkable nature of absorber 12 allows suppression cover 10 to conform to the outer surface shape of an otherwise reflective structure. During shrinkage, the only forces acting to reduce the cover size are forces internal to the binder material, typically molecular forces, initiated when the cover is subjected to an agent external to the cover. The agent may be selected from the group consisting of heat applied to the cover, evaporation of a solvent applied to the cover, and release of a force applied to change the size of the cover.

Sealant 18 improves the fit of cover 10 to a structure which has an irregular shape or voids in its surface. For example, the embodiment of FIG. 1 is suitable for covering a multiple-core twisted braided cable or antenna which has spiral grooves between the cable strands. After shrinkage, the voids in the conductor surface are filled with sealant 18, reducing air gaps between the cable and the cover 10.

After shrinkage, sealant 18 should protect the inner surface of the cover and the structure from the surrounding environment, i.e., be watertight, airtight, resist chemical degradation, etc. In a preferred embodiment, sealant 18 is a material which is solid in the temperature range in which the cover is first applied to the structure, but semisolid or fluid at elevated temperatures, preferably about 100 to 150 degrees C. Thus, once the cover has shrunk to the shape of the structure by whatever method is appropriate, heat may be applied to allow the sealant to flow and fill any gaps between the structure and the cover. In the case of a heat-shrinkable cover, the shrinkage of the cover and the flow of the sealant can occur together, both initiated by the application of heat to the cover.

In another preferred embodiment, sealant 18 is an adhesive which bonds to the reflecting structure, reducing the chance that adhered cover 10 will peel off the structure in use. This adhesive should have good adhesion to the suppression cover and structure materials present in a given application. Pressure sensitive adhesives are suitable. In the case of a heat-shrinkable cover, if an adhesive which is tacky only above ambient temperature is used, the shrinkage of the cover and the adhesion can occur together, both initiated by the application of heat to the cover. Suitable meltable adhesive materials include: a blend of an amine-terminated polyamide and an ethylene/acrylic acid copolymer; polystyrene-polybutadiene block copolymers and their hydrogenated versions; ethylene copolymers such as those available from E.I. du Pont de Nemours and Company under the trade name "ELVAX"; and others. Depending on the material chosen, various additives may be chosen to fit the material to a particular application.

In some cases, the structure may be already installed between supports, making it difficult or impossible to position a tube around the structure, at least without extensive disassembly of the installed structure. FIG. 1 also shows a preferred embodiment for these instances, a tubular cover having a slit parallel to its long axis. Although a flat rectangular suppression material could be wrapped into the configuration of FIG. 1, we prefer to use an extruded tubular cover which has been cross-linked, expanded, and then slit; or a flat sheet which is extruded, cross-linked, tendered and wrapped around a suitable object to form a tube. Flat suppression sheets tend to be stiff enough to introduce undesirable stresses into the sheet when fully wrapped around a structure prior to full shrinkage. Extruded tubes or sheets require less deformation of the cover during installation, minimizing stresses in the material.

Figure 2A:
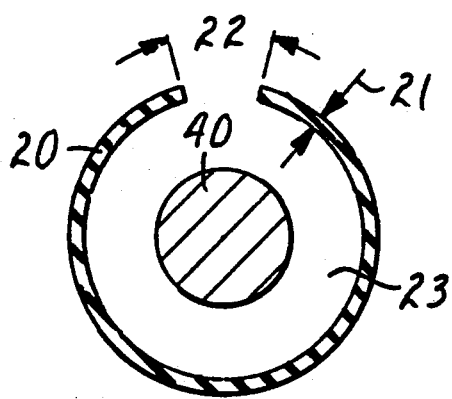
FIGS. 2A, 2B, 2C, 3A, 3B, and 3C are cross-sectional views of other embodiments of the invention applied to a reflecting structure.
Figure 3A:
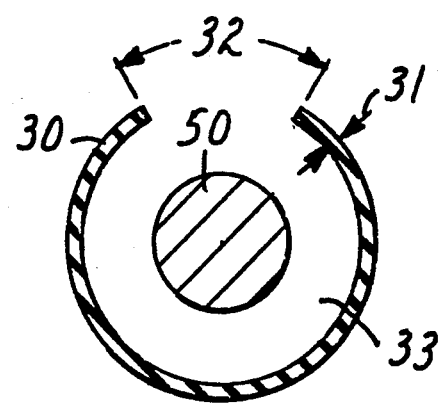

Referring to FIGS. 2A-C and 3A-C, covers 20 and 30 are positioned around installed structures 40 and 50, respectively. In FIGS. 2A and 3A, covers 20 and 30 initially have equal thicknesses 21 and 31, and are positioned at equal radial distances from structures 40 and 50. The sizes of covers 20 and 30 are such that there is no contact between them and structures 40 and 50, respectively, and the radial gaps between the covers and their respective structures are the same. The covers have unequal kerf widths 22 and 32.

Figure 2B:
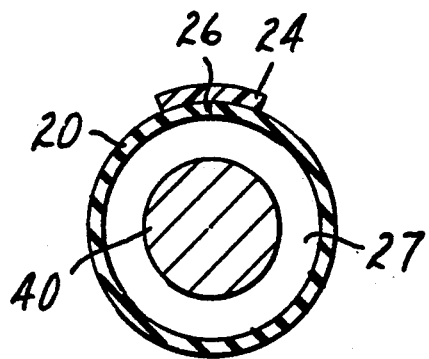
Figure 3B:
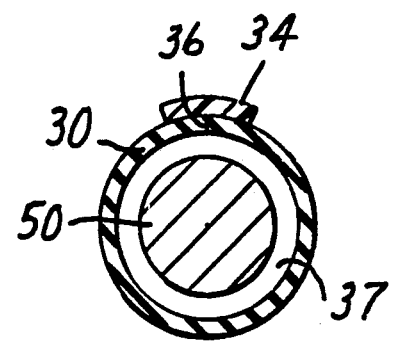

In FIGS. 2B and 3B, covers 20 and 30 are joined with pressure sensitive adhesive tapes 24 and 34, respectively, with the respective edges of the covers in direct contact with each other to form seams 26 and 36. A suitable tape 24 or 34 must be strong enough to hold the edges together during shrinkage, i.e., withstand the effects of the external agent (the elevated temperatures of heat shrinking, for example) and the forces of shrinkage itself; proper adhesion to the cover also depends on the particular material chosen for the binder. A preferred tape is that taught by U.S. Pat. No. 4,731,273 (Bonk et al.), and it is effective without priming of the cover surface as taught in the parent application cross-referenced above.

Once shrinkage is complete, tapes 24 and 34 may be removed. In the preferred embodiment, the meltable adhesive sealant described above ensures that covers 20 and 30 stay adhered to structures 40 and 50, and generally there is some flow of the adhesive sealant into the joints, helping to prevent peeling apart of the cover at the seams.

Figure 2C:
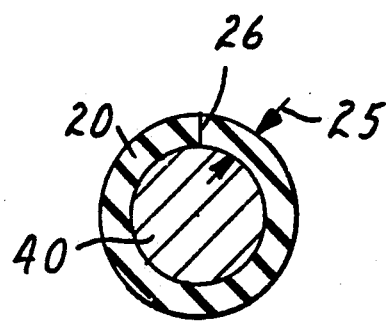
Figure 3C:
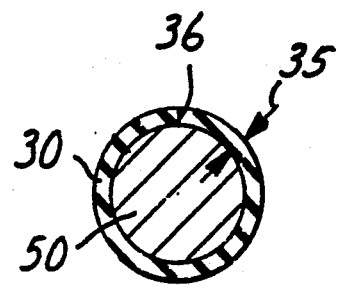

The unequal kerf widths 22 and 32 lead to unequal volumes of enclosed spaces 27 and 37, respectively, as shown in FIGS. 2B and 3B. However, the amount of material, by volume, in each cover 20 or 30 is essentially the same in its initial state before shrinkage and its final shrunken state; of course, because of the unequal kerf widths the two cover amounts are not equal to each other. Thus, because covers 20 and 30 will shrink to eliminate completely the enclosed spaces 27 and 37, respectively, the final thicknesses 25 and 35 are unequal, as shown in FIGS. 2C and 3C. The final thicknesses are usually greater than the respective initial thicknesses depending on the amount of kerf widths removed.

The final thickness of a suppression cover is one of the parameters determining the absorption performance. Thus, one method for adjusting a frequency at which the suppression cover exhibits a local maximum of absorption (a resonant frequency) is to change the final thickness after shrinkage. In this embodiment of the invention, the final amount, by volume, of the shrunken cover is changed by changing the kerf width before shrinkage. Because the dimensions of the reflecting structure are constant, varying the final amount varies the thickness and thus the resonant frequency or frequencies.

In general terms, an inventive cover is chosen to be substantially shaped like the reflecting structure, but larger in at least one dimension. Thus, the volume enclosed by the cover is greater than the volume of the reflecting structure. The volume of the cover material before shrinkage is changed, which changes the difference between the volume enclosed by the cover and the volume of the structure. The conformable cover completely eliminates this volume differential, producing a certain thickness and thus a certain resonant frequency.

As applied to the covers 20 and 30, their inner radii are greater than the outer radii or structures 40 and 50, respectively. Changing kerf widths 22 and 32 changes the amount of covers 20 and 30. Joining the edges together changes the spaces 23 and 33 into reduced spaces 27 and 37. The reduced spaces are completely eliminated, producing thicknesses 25 and 35.

A suitable heat shrinkable polymeric binder is a thermoplastic material capable of having a selected stress locked into it. Both crystallizable and amorphous polymers or copolymers which can be cross-linked or oriented may be used to lock in stresses. Melt temperatures should be above ordinary room temperature, typically 95° C. to 225° C. The crystallizable materials can be selected from the polyolefin polymers and copolymers, including polyethylene, polypropylene and polyvinyl chloride. The amorphous materials can be selected from the silicone, polyacrylate and polystyrene polymers and copolymers. Fluorocarbon polymers, such as those available from Minnesota Mining and Manufacturing Company under the trade name "FLUOREL," may be used. A copolymer introduced to provide cross-linking prevents melting of the thermoplastic during heat shrinkage. Electron beam cross-linking may also be used, but because the cover is usually over 0.25 cm thick before shrinkage, chemical cross-linking is generally preferable.

The heat will usually be applied by convection or conduction rather that by radiation, but infrared, microwave and induction heating and electric current may be used, depending on the binder chosen.

A suitable heat shrinkable polymeric binder comprises the ingredients listed in Table I:

TABLE I

| Co. | Product Designation | Chemical Composition | Weight Fraction (Percent) |
|---|---|---|---|
| U | DPDA 6181 | Ethylene-ethyl acrylate copolymer | 26.82 |
| U | DPDA 6189 | Ethylene-ethyl acrylate copolymer | 26.82 |
| D | FR-300 BA | Decabromo diphenyloxide | 24.49 |
| A | KR | Antimony oxide | 8.16 |
| M | Maglite D | Magnesium oxide | 4.37 |
| N | Kodox 15 | Zinc Oxide | 3.21 |
| S | SR 350 | Trimethylol propane trimethacrylate | 3.21 |
| C | Irganox 1010 | Hindered phenol antioxidant | 1.17 |
| C | Irganox 1024 | Irganox 1010 plus metal deactivator | 1.17 |
| E | #400 | Stearic acid | 0.58 |
|   |   |   | 100.00 |

A = Amspec Company
C = Ciba-Geigy Corporation
D = Dow Corning Corporation
E = Emery Company
M = Merk Company
N = New Jersey Zinc Company
S = Sartomer Company
U = Union Carbide Corporation The antimony oxide together with the decabromo diphenyloxide adds flame retardancy to the binder. The zinc oxide and the magnesium oxide are heat stabilizers for the resin to aid in maintaining its polymeric form, particularly during compounding and fabricating. The trimethylol propane triacrylate promotes cross-linking. The hindered phenols are for oxidative stability during use of the suppression cover (typically in air), and the metal deactivator inhibits corrosion of metal particulates distributed in the binder. The stearic acid is a processing aid serving as an internal lubricant. The blend of two similar resins provides a balance of physical properties and processing properties, such as tensile strength and flexibility and viscosity.

Other suitable polymeric binders are solvent shrinkable, i.e., the initiating event is the evaporation of a solvent from the binder. In this embodiment the polymeric binder can be an elastomer selected from (i) the synthetic rubbers, such as the reactive dienes and diene polymers including polychloroprenes, ethylene propylene rubbers (especially EPDM), and the like, and (ii) the natural rubbers. Suitable solvents for solvent shrinking can be selected from the aromatic hydrocarbons and the aliphatic hydrocarbons.

In another embodiment the polymeric binder is an elastomer which is mechanically stretched over and around the structure, and then released to allow it to conform to the shape of the structure. The polymeric binder can be an elastomer selected from (i) the synthetic elastomers such as the reactive dienes and diene polymers including polychloroprenes, ethylene propylene rubbers (especially EPDM), silicone elastomers, fluorocarbon elastomers, thermoplastic elastomers, and the like, and (ii) the natural rubbers.

For example, one method of application mechanically stretches a cylindrical embodiment of the invention (one without a kerf cut from it) over an intermediate hollow plastic cylindrical core. The core is larger in diameter than any dimension of the reflecting structure to which the absorber shall be applied. The core is a long thin strip of plastic material tightly wrapped in a spiral pattern. Once in place around the reflecting structure, the core is s&ripped from within the stretched absorber, which collapses around the structure due to the release of the mechanical stretching force. In this embodiment, where no heat or solvent need be employed, pressure sensitive adhesives are preferred sealants, although the meltable adhesives described above may be employed if a separate heating step is performed after shrinkage.

There are several types of dissipative particles suitable for dispersion in the binder, either alone or in combination with each other. Changing the volume fraction of any of the particles may change a resonant frequency or frequencies, the absorption bandwidth(s) about one or more resonant frequency or frequencies, and may require a corresponding different thickness of material to achieve the desired suppression.

The first type of particle, particle type A, is a stabilized magnetic oxide of ferroso-ferric oxide ($FeO_x \cdot Fe_2O_3$) having a thin layer of surface adsorbed cobalt. The value of x is between 1.0 and 1.5, with the cobalt in the surface layer providing one to ten percent of the particle weight. The second, particle type B, is ferric oxide ($\gamma Fe_2O_3$) having a thin adsorbed surface layer of cobalt and doubly ionized iron atoms. Properties of these particles are in Table II.

TABLE II

| Parameter | Particle A | Particle B |
|---|---|---|
| Hc, Coercivity (Oe) | 633 | 655 |
| m, Moment (emu/gram) | 76 | 74 |
| Length (microns) | 0.4 | 0.4 |
| Shape | acicular | acicular |
| Aspect ratio | 6:1/8:1 | 6:1 |

The volume fraction of the particles might range from a low of 1 percent to a high of the loading limit of the binder, which might be somewhere between 45 percent to 70 percent by volume. Typically, a preferred range is from 15 percent to 30 percent. The length may range from a low of 0.001 micron (preferably 0.05 micron) to a high of several microns.

A third type of dissipative particle, particle C, is carbonyl iron spheres available from GAF under the designation SF, having the properties in Table III.

TABLE III

| Parameter | Particle C |
| --- | --- |
| Hc, Coercivity (Oe) | 170 |
| m, Moment (emu/gram) | 210 |
| Size, (microns) | 1.3 |
| Shape | Spherical |
| Aspect ratio | 1 |

Another suitable dissipative particle comprises acicular magnetic metallic filaments having an average length of about 10 microns or less, a diameter of about 0.1 micron or more, and aspect ratios between 10:1 and 50:1, preferably chosen from the group consisting of iron, nickel, cobalt, and their alloys. The use of these filaments in a suppression cover is taught in U.S. Application No. 07/302,427, filed Jan. 26, 1989, entitled MICROWAVE ABSORBER EMPLOYING ACICULAR MAGNETIC METALLIC FILAMENTS, assigned to the assignee of this application, copending.

In the embodiments of this invention, preferred filaments have lengths of 5 microns or less and additionally have nonconductive coatings to prevent surface oxidation, which can change the absorption performance of the composite, among other effects. Nonconductive coatings also reduce conductive contact between particles, which can cause the cover to behave like a conductive shield, reflecting radiation rather than suppressing it.

Suitable nonconductive coatings are dispersing agents with phosphoric acid, amine, sulfonate, or carboxylic acid functional groups. For example, a suitable agent with a phosphoric acid functional group is "GAFAC" type RE-610 supplied by GAF Corporation. Additionally, to produce suitable coated iron filaments, each of the following three procedures is acceptable:

A. A sufficient amount of methyl ethyl ketone is added to a given amount of long iron filaments (100–500 microns length) to form a slurry. A dispersing agent may be used to improve the process. The mixture is pulverized in a high speed blade mixer and/or a sand mill until the filament lengths are about 5 microns or less, then dried in a vacuum.

B. One hundred parts by weight of long iron filaments are added to 5 parts by weight of polystyrene-polybutadiene block copolymer ("KRATON" type 1101 supplied by Shell Chemical Company), and sufficient cyclohexane solution to form a slurry. The mixture is passed through a paint mill repeatedly until the filament lengths are about 5 micron or less, then dried in a vacuum oven at 50° C.

C. The following ingredients are mixed in a Banbury mixer for ten minutes: Ethylene Propylene Terpolymer ("NORDEL" 1440 by E.I. du Pont de Nemours and Company), 43 percent by weight; long iron filaments, 47 percent; 1,2 Dihydro-trimethyl Quinoline Polymer ("AGERITE MA" by R.T. Vanderbilt), 1 percent; aliphatic fatty acid esters ("STRUKTOL" WB-16 by Struktol), 0.5 percent; antimony oxide (type KR by Amspec Chemical Company), 3 percent; 1,3 Butylene Glycol Dimethacrylate (type SR 297 by Atlantic Richfield Company), 1.5 percent. The compound is then milled in a 2-roll rubber mill for 45 to 60 minutes at approximately 80° C. At the end of the milling process, 4 percent by weight of Bis(tert-Butylperoxy Isopropyl) Benzene ("VULCUP" 40KE by Hercules Chemical Company) is added as a curing agent, cross-linking the final product.

Referring again to FIG. 1, many suppression covers employ an absorber 12 which is designed to operate with a conductive ground plane between the absorber and the covered structure. If the structure itself has a conductive surface, it may serve as the ground plane. However, to ensure that a ground plane is present for any application, a conductive layer 16 may be added to any embodiment of the invention. Conductive layer 16 may be a thin application of conductive paint, brushed or sprayed onto absorber 12. Also, conductive particles may be compounded into sealant 18 at a volume loading sufficient to ensure that the sealant layer is conductive after shrinkage.

In a preferred embodiment, a thin metallic foil serves as optional conductive layer 16 and is bonded between absorber 12 and sealant 18 with optional adhesive 14. A suitable adhesive is prepared by mixing (by weight) 50 percent polystyrene-polyisoprene block copolymer identified by Shell Chemical Company as "KRATON" type 1107, and 50 percent synthetic polyterpene tackifier identified by Goodyear Chemical Company as "WINGTACK PLUS," in a hot-melt mixer or in toluene solvent. Small amounts of antioxidant and thermal stabilizer should be added to improve the aging characteristics of the adhesive. A suitable metallic foil 16 is 0.0085 mm thick aluminum, but any conductive metal may be used.

For any embodiment of the invention, impedance matching of the absorber to the incident medium (usually air) is preferred but not required. Typically the match is done by a material having permeability and permittivity values that minimize reflection of microwaves at the surface of incidence. Usually a layer of such impedance matching material is added to the absorber, and the dimensions, weight, etc. of the layer are considered in the complete design. For example, a suitable impedance matching material comprises 5 to 25 volume percent hollow glass microbubbles identified by Minnesota Mining and Manufacturing Company as type S60/10000 "SCOTCHLITE" brand glass bubbles, dispersed in "NORDEL" type 1440 EPDM supplied by E.I. du Pont de Nemours and Company.

EXAMPLE 1

To study the effect of kerf width on the resonant frequency of suppression covers, a tube having an inside diameter of 6.0 cm and a thickness of 0.35 cm was extruded from a composition comprising (by volume) 10 percent Particle type A (Table II), 10 percent Particle type B (Table II), and 80 percent ethyleneethyl acrylate (EEA) type binder (Table I). The extruded tube was irradiated with 4 megarads of electron beam radiation and expanded to 8.9 cm inside diameter. After expansion, the tube had a thickness of 0.24 cm. Three samples, each 61 cm long, were cut and identified as Samples A, B, and C. A kerf was cut along the entire length of each Sample. The kerf widths were: Sample A, 0 cm (i.e., negligible compared to the other Samples); Sample B, 1 cm; Sample C, 2 cm. Each Sample was placed over a 61 cm long hollow aluminum cylinder having an outside diameter of 6.35 cm and taped along the full area of the kerf with a tape made in accordance with U.S. Pat. No. 4,731,273 (Bonk et al.). The covered aluminum cylinders were placed in an oven and exposed to 149° C. for ten minutes, during which time each Sample shrunk tightly to the aluminum tube. The thicknesses of each Sample after shrinkage were: Sample A, 0.33 cm; Sample B, 0.28 cm; Sample C, 0.25 cm.

Figure 4:
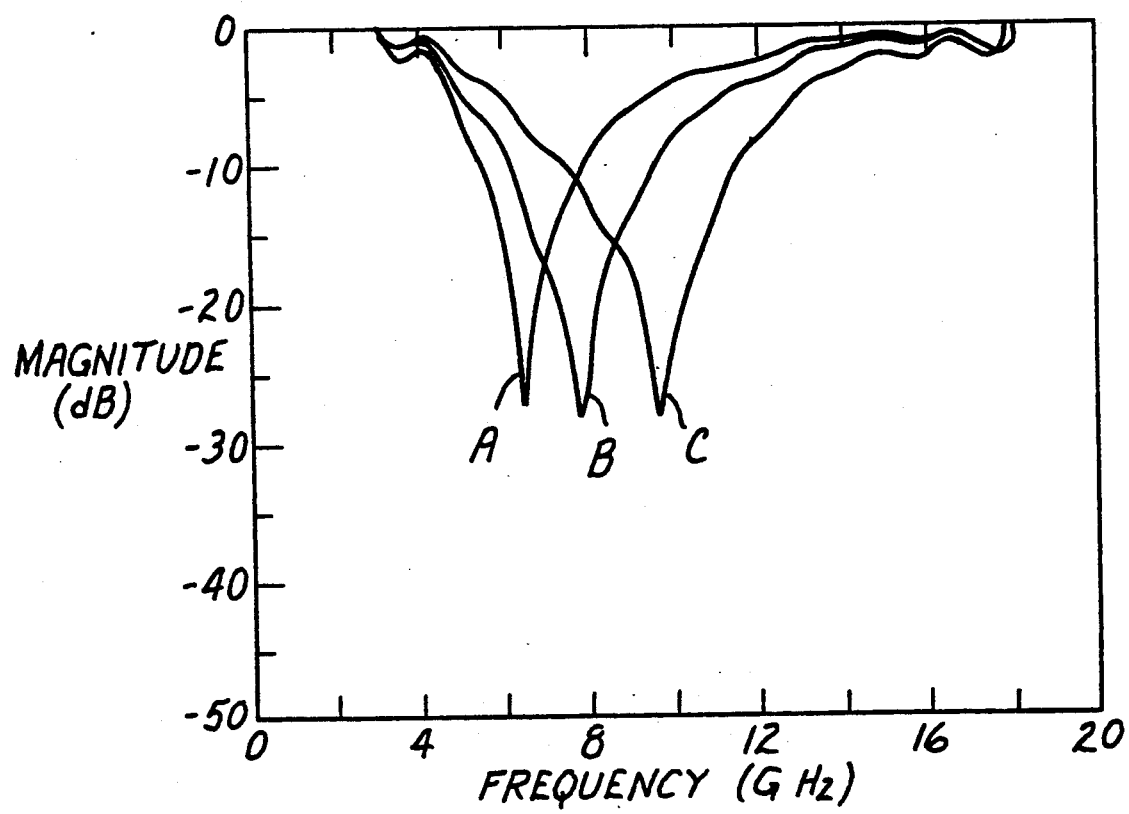
FIG. 4 is a graph of the absorption response of three samples of another embodiment of the invention, as a function of incident radiation frequency.

FIG. 4 is a graph of the absorption response of each covered aluminum tube, as a function of the frequency of radiation incident of the shrunken covers perpendicular to the axis of the covered cylinder. The curves are identified by the letter corresponding to the Sample cover used. The graph confirms that the method of varying the cover volume by varying the kerf width successfully varies the resonant frequency of the suppression cover, with little effect on the magnitude of the total absorption at or near the respective resonant frequencies.

Each Sample showed absorption in the range of 3-18 GHz. The approximate resonant frequencies are: Sample A, 6.4 GHz; Sample B, about 7.8 GHz; Sample C, 9.6 GHz. Each Sample cover shows absorption of at least 25 dB (i.e., a reduction in reflection of at least 99.68 percent, well above the 70 percent required) at its respective resonant frequency. The thickness of each sample is within the required wavelength range of one fortieth (2.5 percent) to one fourth (25 percent) of the 3-18 GHz frequency range, i.e., 0.042 to 2.5 cm.

We claim:

1. A method of adjusting a frequency at which an electromagnetic radiation suppression cover exhibits a local maximum absorption of radiation incident upon a reflecting structure in a given direction, comprising the steps of:
   (a) selecting a suppression cover which is
      (1) substantially shaped like the reflecting structure but larger in at least one dimension, and
      (2) conformable to the shape of the reflecting structure due to forces internal to the cover when the cover is subjected to an agent external to the cover;
   (b) changing the amount of the conformable cover; and
   (c) conforming the cover of step (b) to the shape of the reflecting structure by subjecting the cover to the external agent, the conformed amount of the cover in the given direction of radiation propagation being greater than one-fortieth but not greater than one-fourth of the wavelength of any radiation in the range of selected absorbed radiation frequencies.

2. The method of claim 1 in which the suppression cover is substantially a slit tube having edges defining a kerf width, and step (b) comprises changing the kerf width and rejoining the edges.

3. The method of claim 1 in which the suppression cover comprises:
   (a) at least one radiation absorber, having permittivity and permeability parameters each with real and imaginary parts, and comprising dissipative particles dispersed in a conformable polymeric binder, in which, measured at a frequency within a range of selected absorbed radiation frequencies, the imaginary part of at least one of the absorber permittivity and permeability values is greater than or equal to ten percent of the corresponding real part, and
   (b) a sealant positioned to seal the conformable absorber to the reflecting structure.

4. The method of claim 1 in which the suppression cover comprises:
   (a) at least one radiation absorber which comprise dissipative particles dispersed in a conformable polymeric binder, and
   (b) a sealant positioned to seal the conformable absorber to the reflecting structure;
in which the cover is characterized by a reduction in electromagnetic reflection coefficient of the structure of no less than 70 percent, as measured at a frequency within a range of absorbed radiation frequencies after the cover has conformed to the reflecting structure.

* * * * *

UNITED STATES PATENT AND TRADEMARK OFFICE
CERTIFICATE OF CORRECTION

PATENT NO. :   5,106,437
DATED      :   April 21, 1992
INVENTOR(S) :  Felix P. Lau, Donald M. Yenni, Jr.
               Ronald W. Seemann and Richard J. Kuo It is certified that error appears in the above-identified patent and that said Letters Patent is hereby corrected as shown below:

Column 6, line 24, delete "s&ripped" and insert
--stripped--.

Column 10, line 29, delete "comprise" and insert
--comprises--.

Signed and Sealed this

Thirteenth Day of July, 1993

Attest:

MICHAEL K. KIRK

Attesting Officer           Acting Commissioner of Patents and Trademarks